(12) United States Patent
Djordjevic et al.

(10) Patent No.: US 6,809,613 B2
(45) Date of Patent: Oct. 26, 2004

(54) LOW-REFLECTION TRANSMISSION-LINE FILTERS WITH GAUSSIAN CHARACTERISTICS

(75) Inventors: Antonije R. Djordjevic, Belgrade (YU); Aleksandra Stekovic, Belgrade (YU); Marcel F. C. Schemmann, Maria-Hoop (NL); Zoran Maricevic, Manlius, NY (US)

(73) Assignee: Teradvance Communications, LLC, Fayetteville, NY (US)

(*) Notice: Subject to any disclaimer, the term of this patent is extended or adjusted under 35 U.S.C. 154(b) by 0 days.

(21) Appl. No.: 10/335,563

(22) Filed: Dec. 30, 2002

(65) Prior Publication Data

US 2003/0201845 A1 Oct. 30, 2003

Related U.S. Application Data

(63) Continuation of application No. 10/132,357, filed on Apr. 25, 2002.
(51) Int. Cl.[7] .......................... H03H 7/06; H03H 7/075
(52) U.S. Cl. ...................................... 333/167; 333/172
(58) Field of Search ................................ 333/167, 168, 333/172, 175, 176, 181

(56) References Cited

U.S. PATENT DOCUMENTS

| | | | | |
|---|---|---|---|---|
| 4,794,353 A | * | 12/1988 | Broyde | 333/167 |
| 5,396,198 A | * | 3/1995 | Yamashita et al. | 333/136 |
| 6,608,536 B2 | * | 8/2003 | Fallahi | 333/168 |
| 6,617,941 B2 | * | 9/2003 | Heumann | 333/167 |

* cited by examiner

Primary Examiner—Robert Pascal
Assistant Examiner—Dean Takaoka
(74) Attorney, Agent, or Firm—Kenyon & Kenyon

(57) ABSTRACT

A transmission line filter having low reflectivity and Gaussian characteristics includes at least one inductive element aligned along the transmission line and at least one shunt configuration branching off the transmission line including a capacitive element and a resistive element. The transmission line filter is embodied in complete and incomplete Gaussian filters, and in both lumped element and distributed-element configurations. A method of designing a transmission line filter having low reflectivity and Gaussian characteristics is provided in which values for desired filter parameters are ascertained, formulas for the values of the inductive, capacitive and resistive elements are derived in terms of the desired filter parameters and the number of half-cells, a number of half-cells for the filter required to achieve the desired filter parameters is selected, and lumped element values for the inductive, capacitive, and resistive elements are estimated using the selected number of half-cells.

23 Claims, 6 Drawing Sheets

LOW-REFLECTION TRANSMISSION-LINE FILTERS WITH GAUSSIAN CHARACTERISTICS

RELATED APPLICATIONS

The present application is a continuation of U.S. patent application Ser. No. 10/132,357, filed Apr. 25, 2002.

FIELD OF THE INVENTION

The present invention relates to digital signal transmission, and in particular, relates to transmission line filters having both low-reflection and Gaussian amplitude characteristics.

BACKGROUND INFORMATION

In digital signal transmission, Gaussian-like frequency-domain transfer functions are often desirable because they effectively cut off high frequency components and do not yield overshoots and ringing in the time domain. A well-known example of a filter that has such functional characteristics is the Bessel-Thomson filter. These filters have been used in microwave range transmission in lumped-element and transmission-line design configurations.

Bessel-Thomson filters are theoretically lossless since they do not incorporate resistive elements and they provide for a maximally flat group delay. Even in practical implementations in which some amount of electrical resistance is inevitable, the magnitude of the transmission transfer function in the passband for such filters ($|s_{21}|=|s_{12}|$) is close to 1 (0 dB) and the magnitude of the reflection coefficient ($|s_{11}|=|s_{22}|$) is close to 0. The filters have a mild transition from the passband to the stopband, where the magnitude of the transfer function and reflection coefficients reverse, with the transfer function dropping to approximately zero, and the reflection coefficient rising to approximately 1. Thus, in the stopband, the Bessel-Thomson filter acts approximately as a pure reflector, which is an undesirable effect for many digital communication applications.

SUMMARY OF THE INVENTION

The present invention provides a transmission line filter having low reflectivity and Gaussian characteristics that includes at least one inductive element aligned along the transmission line and at least one shunt configuration branching off the transmission line including a capacitive element and a resistive element. In accordance with one embodiment, the capacitive element and the resistive element are in series in the at least one shunt configuration.

According a particular embodiment, the at least one inductive element, the capacitive element, and/or the resistive element are distributed parameters which are spread evenly over the transmission line.

According to a further embodiment, the present invention provides a complete Gaussian transmission line filter that includes at least one resistive element aligned in the direction of transmission parallel to the at least one inductive element.

The present invention also provides a complete Gaussian transmission line filter in which the line parameters are configured as lumped elements. According to this embodiment, the transmission line filter includes a discrete number (N) of half-cell sections distributed in series along the transmission line, each half-cell section further including an inductive element (l) and a resistive element (r) in parallel and aligned in a direction of transmission, and a resistive element (g) and a capacitive element (c) in series and aligned in a shunt configuration branching from the transmission line.

According to further embodiment, the present invention provides an incomplete Gaussian transmission line filter that includes a number (N) of half-cell sections distributed in series along the transmission line, each half-cell section including: a) an inductive element (l) aligned in the direction of transmission; and b) a resistive element (g) and a capacitive element (c) in series and aligned in a shunt configuration branching from the transmission line.

The present invention also provides a topology for modeling a transmission line filter having low reflectivity and Gaussian characteristics. The topology includes a ladder network having both a plurality of inductive elements aligned in series along a direction of transmission, and a plurality of shunt branches coupled to the inductive elements and aligned away from the direction of transmission, each shunt branch having a capacitive element and a resistive element coupled in series. The topology is used to generate parameter values for the inductive, and capacitive and resistive elements for achieving specified filter characteristics.

According to one embodiment, the ladder network includes a plurality of resistive elements aligned in series along the direction of transmission, parallel to the plurality of inductive elements.

According to a particular embodiment, the plurality of inductive elements, the plurality of capacitive elements, and the plurality of resistive elements are modeled as being distributed per unit length over the transmission line.

According to a further embodiment, the ladder network includes a number of (N) half-cell sections including a first end half-cell section, a second end half-cell section, and intermediate half-cell sections. Each half-cell section includes one inductive element and one shunt branch, values for the inductive, capacitive and resistive elements within all intermediate half-cells being identical.

The present invention also provides a method of designing a transmission line filter having low reflectivity and Gaussian characteristics, in which the transmission line filter includes a number of half cells, each half cell having an inductive element aligned along the transmission line, and a shunt branch off of the transmission line, the shunt branch having a capacitive and a resistive element in series. The method includes ascertaining values for desired filter parameters, deriving formulas for the values of the inductive, capacitive and resistive elements in terms of the desired filter parameters and the number of half-cells, selecting a number of half-cells for the filter required to achieve the desired filter parameters, and estimating lumped element values for the inductive, capacitive, and resistive elements using the selected number of half-cells.

According to a particular embodiment of the method of the present invention, the inductive, capacitive, and resistive elements of the transmission line are modeled as distributed line parameters prior to deriving the formulas for the values of the elements.

According to a further embodiment, the estimated values for the lumped element values are optimized using a circuit simulator.

According to a further embodiment, the number of half-cells is selected to provide a cutoff frequency for the filter above a threshold level.

According to a further embodiment, the number of half-cells are selected in order to obtain the optimized lumped element values and the number of half-cells selected is approximated as an integer value.

According to a particular implementation of the method of the present invention directed to achieving highly linear phase characteristics, a cutoff frequency for the filter is recomputed, the lumped element values are re-estimated using the recomputed cutoff frequency, and the lumped element values using the circuit simulator are re-optimized.

The present invention also provides for implementing estimated lumped element values of the inductive, capacitive, and resistive elements as distributed line inductance, capacitance, and resistance respectively, and also provides for implementing the distributed line inductance, capacitance, and resistance using printed-circuit coils, transmission-line sections, and/or microstrip sections.

According to another embodiment, the present invention also provides a method of designing a transmission filter having low reflectivity and Gaussian characteristics in which the transmission line filter includes a number of half cells, each half cell having an inductive element aligned along the transmission line, and a shunt branch off of the transmission line, the shunt branch having a capacitive and a resistive element in series. The method includes generating a lumped element model of the transmission line filter, estimating lumped element values for the inductive, capacitive, and resistive elements, and approximating the lumped element values using distributed inductance, capacitance, and resistance. The distributed inductance, capacitance, and resistance are then implemented using one of printed-circuit coils, transmission-line sections, and microstrip sections.

DETAILED DESCRIPTION

Figure 1:
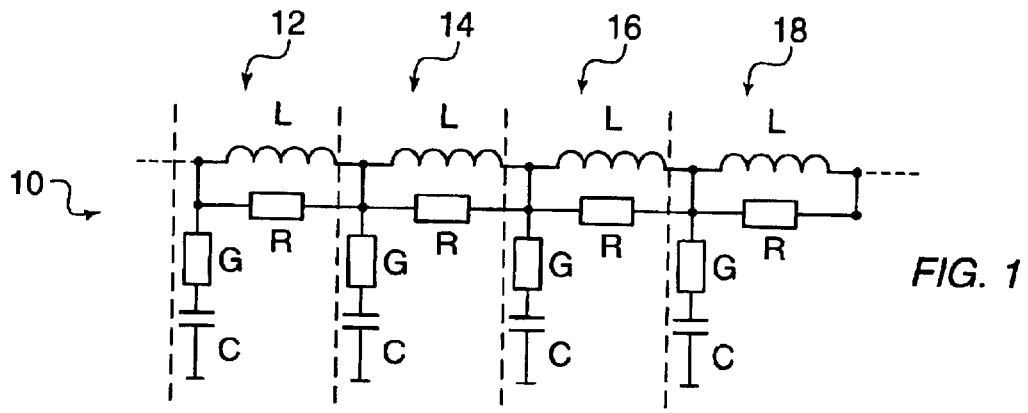
FIG. 1 illustrates a lumped element topology of a complete Gaussian transmission line according to an embodiment of the present invention.

FIG. 1 shows a lumped-element topology of a transmission line according to an embodiment of the present invention that has low-reflectivity in the stopband and a Gaussian transfer function in the passband frequency domain. The lumped-element network is a substantially accurate approximation of a lossy transmission line at lower frequencies. But as the signal frequency increases, the lumped-element network begins to behave like a low-pass filter. Hence, for a given transmission line, the approximation will hold up to higher frequencies if the lumped-element network contains more half-cells, i.e., if the number of repeating elements becomes large. As shown in FIG. 1, transmission line 10 includes a number (N) of half-cell sections e.g., 12, 14, 16, 18, each section includes an inductive coil (L) and a resistor (R) in a parallel aligned in the direction of transmission, which models conductor losses, and a capacitor (C) and a resistor (G) in series in a shunt configuration, which models dielectric losses. At low frequencies, the resistors (R) are shorted by the inductive coils (L), while the capacitors (C) behave as open circuits. Thus, the network has negligible insertion loss at zero frequency. As frequency increases, the impedance of the coils (L) increases and the reactance of the capacitors (C) decreases to the point where at very high frequencies, the coils behave as open circuits and the capacitors behave as short circuits, leaving a purely resistive ladder network which has a constant attenuation.

The lumped element depiction shown in FIG. 1 can be converted into a distributed model (i.e., $N \rightarrow \infty$) by using inductance, resistance, and capacitance per unit length as parameters of the transmission line. Accordingly, the per-unit length impedance of the transmission line 10 is then $$z = \frac{j\omega rl}{r + j\omega l}, \quad (1)$$

and the per-unit-length admittance is $$y = \frac{j\omega gc}{g + j\omega c}. \quad (2)$$

Parameters r, l, c, and g(conductance) are assumed to be frequency independent and related by Heavyside's condition:

$$\frac{r}{l} = \frac{g}{c}. \tag{3}$$

The characteristic impedance of the line is given by:

$$Z_c = \sqrt{\frac{z}{y}}. \tag{4}$$

Under the condition (3), equation (4) yields:

$$Z_c = \sqrt{\frac{l}{c}} = \sqrt{\frac{r}{g}}. \tag{5}$$

Introducing the break-point angular frequency, $$\omega_b = \frac{r}{l} = \frac{g}{c}. \tag{6}$$

equations (1) and (2) can be rewritten as:

$$z = \frac{j\frac{\omega}{\omega_b}r}{1 + j\frac{\omega}{\omega_b}} \tag{7}$$

$$\text{and } y = \frac{j\frac{\omega}{\omega_b}g}{1 + j\frac{\omega}{\omega_b}}, \text{ respectively.} \tag{8}$$

The propagation coefficient, $\gamma = \sqrt{zy} = \alpha + j\beta$ is then calculated as $$\gamma = \tag{10}$$

$$\frac{j\frac{\omega}{\omega_b}\sqrt{rg}}{1 + j\frac{\omega}{\omega_b}} \approx \sqrt{rg}\left(\left(\frac{\omega}{\omega_b}\right)^2 - \left(\frac{\omega}{\omega_b}\right)^4\right) + j\sqrt{rg}\left(\frac{\omega}{\omega_b} - \left(\frac{\omega}{\omega_b}\right)^3\right).$$

The approximation of equation (10) is particularly accurate when $\omega << \omega_b$. The real part of the propagation coefficient, i.e., the attenuation coefficient of the line, is $$\alpha = \frac{\left(\frac{\omega}{\omega_b}\right)^2 \sqrt{rg}}{1 + \left(\frac{\omega}{\omega_b}\right)^2}. \tag{11}$$

The imaginary part of the propagation coefficient, i.e. the phase coefficient is $$\beta = \frac{\frac{\omega}{\omega_b}\sqrt{rg}}{1 + \left(\frac{\omega}{\omega_b}\right)^2} = \frac{\omega\sqrt{lc}}{1 + \left(\frac{\omega}{\omega_b}\right)^2}, \tag{12}$$

since $rg = \omega_b^2 lc$, from equation (6).

When $\omega << \omega_b$, the attenuation of the line follows the Gaussian form, i.e., it is proportional to the frequency ($\omega$) squared. When the frequency approaches $\omega_b$, the amplitude characteristic flattens out, approaching a constant value ($\alpha \to$ $\sqrt{rg}$). Therefore, at higher frequencies in the stopband, the amplitude of transmission does not fall to zero as in Bessel-Thomson filters, but rather introduces finite impedance losses to the transmission signals. Additionally, the phase characteristic is linear, $\beta \approx \omega\sqrt{lc}$, the phase velocity is approximately constant and equal to $1/\sqrt{lc}$, and the group delay is flat. Therefore, the transmission line 10 can be used as a low-pass filter that approximates the Gaussian Bessel-Thomson filters.

Figure 2:
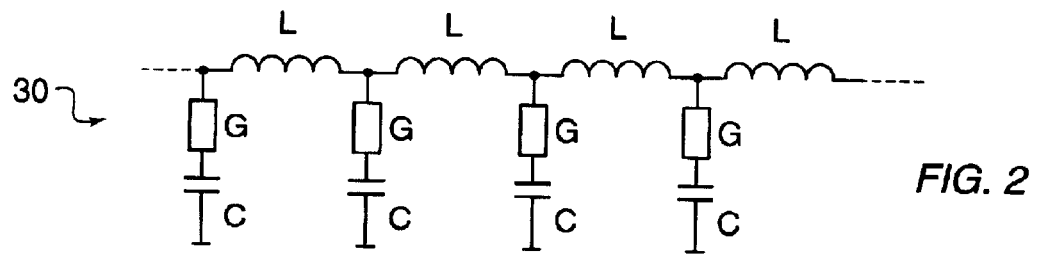
FIG. 2 illustrates a lumped element topology of an incomplete Gaussian transmission line according to an embodiment of the present invention.

FIG. 2 illustrates a topology of an alternate embodiment of a transmission line according to the present invention, denoted an incomplete Gaussian line, since resistors are included in only the shunt branches of the line (the embodiment shown in FIG. 1 is hereinafter referred to as a 'complete' Gaussian line). As shown in FIG. 2, the incomplete Gaussian line 30 includes resistances (G), but does not include resistances (R). However, in an alternative implementation, the transmission line may include only resistances (R) instead of shunt resistances (G).

The per-unit-length impedance and admittance of the incomplete Gaussian line 30 are $z = j\omega l$ (13) and $$y = \frac{j\omega gc}{g + j\omega c} = \frac{j\frac{\omega}{\omega_b}g}{1 + j\frac{\omega}{\omega_b}}, \tag{14}$$

respectively, where, in accordance with equation (6), $$\omega_b = \frac{g}{c}. \tag{15}$$

The characteristic impedance of the incomplete Gaussian line depends on frequency, $$Z_c = \sqrt{\frac{l}{c}}\sqrt{\frac{g + j\omega c}{g}} = \sqrt{\frac{l}{c}}\sqrt{1 + j\frac{\omega}{\omega_b}} \approx \sqrt{\frac{l}{c}}\left(1 + j\frac{\omega}{2\omega_b}\right), \tag{16}$$

where the approximation is particularly valid at lower frequencies, when $\omega << \omega_b$. The characteristic impedance of the line is largely frequency independent when $\omega < 0.5\omega_b$, when the mismatch is less than about 18 dB. The propagation coefficient can then be expressed as $$\gamma = j\omega\sqrt{lc}\sqrt{\frac{1}{1 + j\frac{\omega}{\omega_b}}} \approx \tag{17}$$

$$\omega_b\sqrt{lc}\left(\frac{1}{2}\left(\frac{\omega}{\omega_b}\right)^2 - \frac{5}{16}\left(\frac{\omega}{\omega_b}\right)^4\right) + j\omega_b\sqrt{lc}\left(\frac{\omega}{\omega_b} - \frac{3}{8}\left(\frac{\omega}{\omega_b}\right)^3\right).$$

In comparing the propagation coefficients for the complete and incomplete transmission line in equations (10) and (17) respectively, it can be seen that the real part of the propagation coefficient has a Gaussian behavior at lower frequencies in both cases. The deviations from the ideal characteristic as $\omega \to \omega_b$ are somewhat larger in equation (10) than in equation (17), because the coefficients of the $$\left(\frac{\omega}{\omega_b}\right)^4$$

term are 1 and 0.3125, respectively. The phase coefficient in both (10) and (17) is linear at lower frequencies, and it starts deviating when $\omega \to \omega_b$. The deviations from the linear phase in (10) are also larger than in (17), because the coefficients of the $$\left(\frac{\omega}{\omega_b}\right)^3$$

term are 1 and 0.375, respectively.

Figure 5:
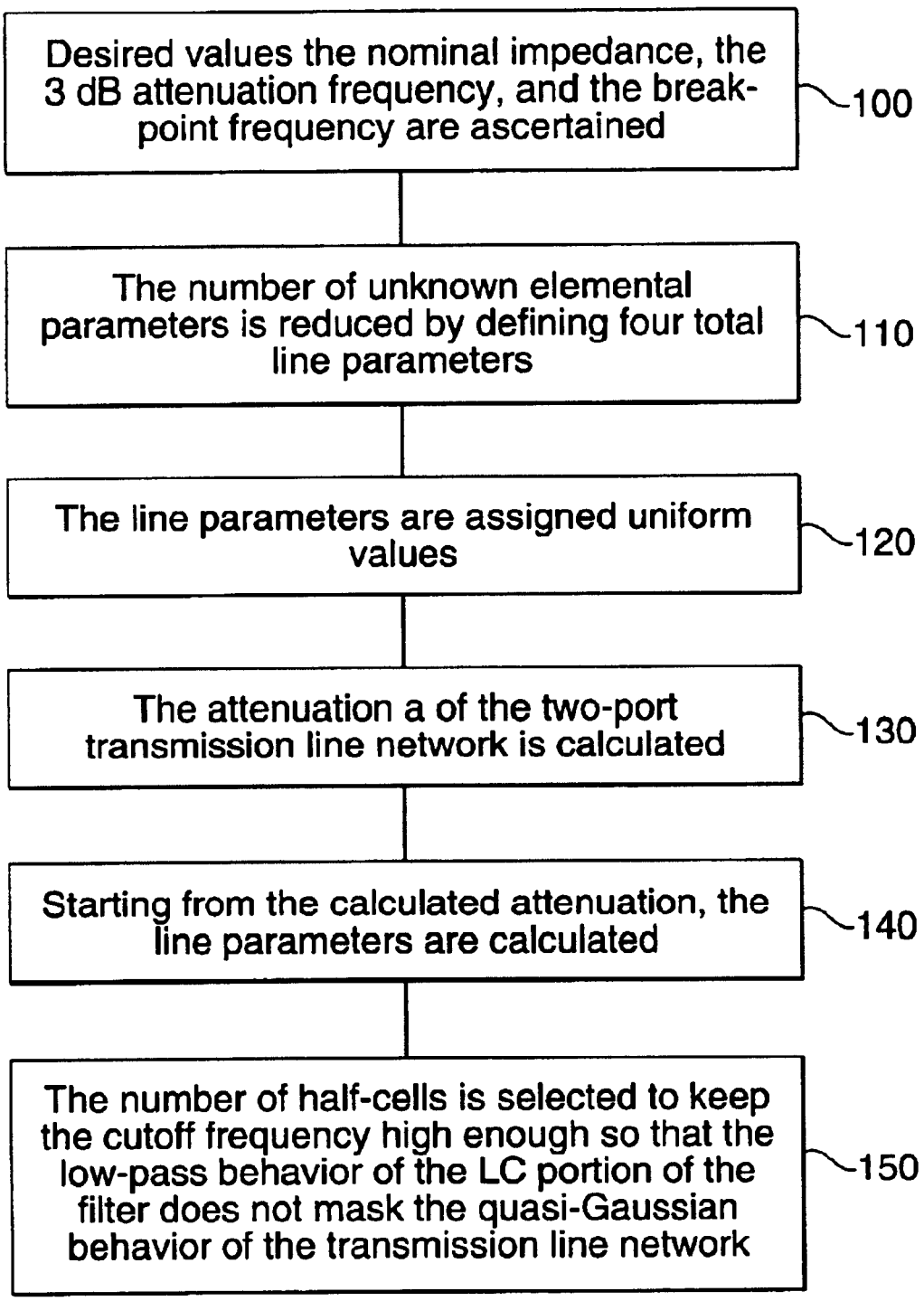
FIG. 5 shows a procedure for evaluating lumped element parameters of a finite lumped-element implementation of a Gaussian transmission line filter according to an embodiment of the present invention.

A design procedure for evaluating the parameters of a Gaussian lumped-element transmission line filter according to the present invention proceeds as follows with reference to FIG. 5. At first, desired values the nominal impedance ($Z_c$), the 3 dB attenuation frequency ($\omega_{3dB}=2\pi f_{3dB}$), and the break-point frequency ($f_b$, $\omega_b=2\pi f_b$), which define the filte characteristics, are ascertained (100). Ultimately, the parameters l, r, c, g, and line length D are calculated using the ascertained parameters and from Heavyside's condition (3). However, since there are five unknown parameters and there are only four known conditions (the ascertained parameters and the Heavyside's condition), the number of unknown parameters is reduced (110) by defining four total line parameters: $L_t=lD$, $R_t=rD$, $C_t=cD$, and $G_t=gD$.

Figure 3:
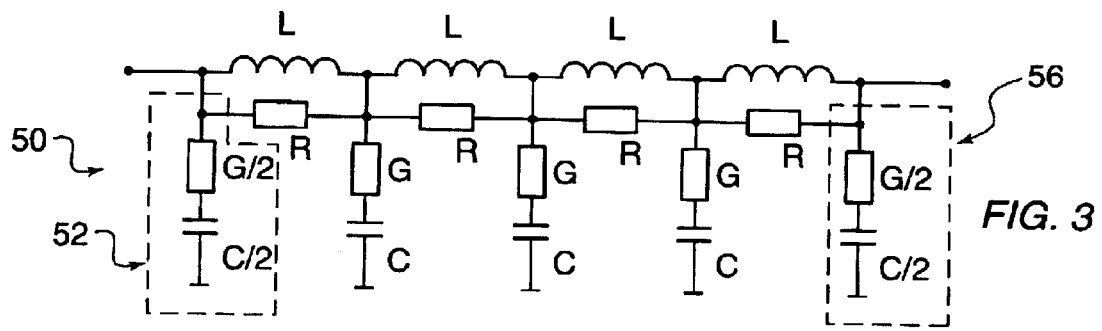
FIG. 3 illustrates a symmetrical topology implementation of a four section complete Gaussian transmission line according to an embodiment of the present invention.

Thereafter, a lumped-element approximation to the complete Gaussian line is generated using a ladder network approximation including N identical half-cells as illustrated in FIG. 1. According to one implementation, the values of the elements are assigned (120) respective values $L=L_t/N$, $R=R_t/N$, $C=C_t/N$, and $G=G_t/N$ in which all corresponding elements have identical values. This implementation may be advantageous for manufacturing purposes, since uniform values for lumped elements may be more easily and cost-effectively achieved. However, a symmetrical topology implementation, in which certain of the values of corresponding elements are non-uniform is also possible. FIG. 3 illustrates an exemplary embodiment of this alternative implementation in a four section (N=4) lumped element filter 50 including an extra shunt branch 56 in which the first 52 and last 56 shunt branches have conductive and capacitive elements with halved-values (G/2, C/2).

To evaluate approximations for the total parameters of the line of FIG. 3, the attenuation a (in dB) of the two-port network is calculated (130), which according to the relation $s_{12dB}=s_{21dB}=-8.686\alpha D$ dB$=-a$ and equation (11) is:

$$a = 8.686 \frac{\left(\frac{\omega}{\omega_b}\right)^2 \sqrt{R_t G_t}}{1+\left(\frac{\omega}{\omega_b}\right)^2} \text{ dB}. \quad (18)$$

Since a=−3 dB at $\omega_{3dB}$, equation (18) resolves to $$\sqrt{R_t G_t} = 0.345 \frac{1+\left(\frac{\omega_{3dB}}{\omega_b}\right)^2}{\left(\frac{\omega_{3dB}}{\omega_b}\right)^2} \approx 0.345\left(\frac{\omega_b}{\omega_{3dB}}\right)^2, \quad (19)$$

where $\omega_{3dB}\ll\omega_b$.

Equation (5) can be rewritten as $$Z_c = \sqrt{\frac{R_t}{G_t}}, \quad (20)$$

so that $$G_t = \frac{R_t}{Z_c^2}. \quad (21)$$

Plugging equation (21) into equation (19) yields:

$$R_t = 0.345 Z_c \frac{1+\left(\frac{\omega_{3dB}}{\omega_b}\right)^2}{\left(\frac{\omega_{3dB}}{\omega_b}\right)^2} \approx 0.345 Z_c \left(\frac{\omega_b}{\omega_{3dB}}\right)^2. \quad (22)$$

In this manner, the total resistance $R_t$ and the other line parameters can be calculated (140) in terms of the 3 dB frequency (the frequency at which the transfer function for the transmission line filter according to the present invention is reduced by half, or 3 dB). $G_t$ can be similarly evaluated from (21), and from equation (6), the line inductance $L_t$ and capacitance $C_t$ can be calculated as $$L_t = \frac{R_t}{\omega_b}, \quad (23)$$

and $$C_t = \frac{G_t}{\omega_b}. \quad (24)$$

The number of half-cells can be selected (150) so as to keep the cutoff frequency $f_c$ (representing the cutoff frequency of a purely LC filter, i.e., calculated as if the transmission line filter contained no resistive elements) high enough (e.g., close to $f_b$), so that the low-pass behavior of the LC portion of the filter does not mask the quasi-Gaussian behavior of the transmission line network. The number of half-cells is then related to $f_c$ by:

$$N=\pi f_c \sqrt{L_t C_t} \quad (25).$$

At this cutoff, the attenuation may be steeper than for a purely Gaussian filter within a certain frequency band.

The lumped-element network approximation obtained according to the above-described procedure can thereafter be further optimized using a circuit simulator as is known and practiced in the art such as, for example, the EEsof line of analog circuit simulators offered by Agilent Technologies Inc. Such circuit simulators use iterative numerical methods to solve simultaneous equations to arrive at optimal values for resistive, inductive, and capacitive elements that produce optimal filter characteristics. After optimization, the lumped element topology is implemented physically using printed-circuit coils, microstrips or transmission-line sections, for example, taking into account the relevant parasitics.

Figure 4:
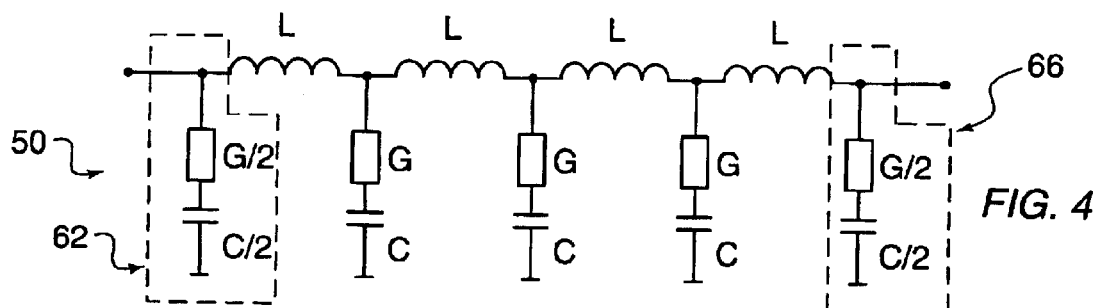
FIG. 4 illustrates a symmetrical topology implementation of a four section incomplete Gaussian transmission line according to an embodiment of the present invention.

An analogous exemplary embodiment of a four section lumped element incomplete Gaussian filter is shown in FIG. 4. In the incomplete filter topology 60, shunt branches 62 and 66 have half-values for resistive and capacitive elements. In a particular implementation for matching a nominal impedance of 50 Ω, it is found that the optimum value of the resistance in the first and last shunt branches of the incomplete Gaussian topology is about 50 Ω. This choice provides a good match far beyond $f_{3dB}$ (theoretically, up to infinity).

Figure 6:
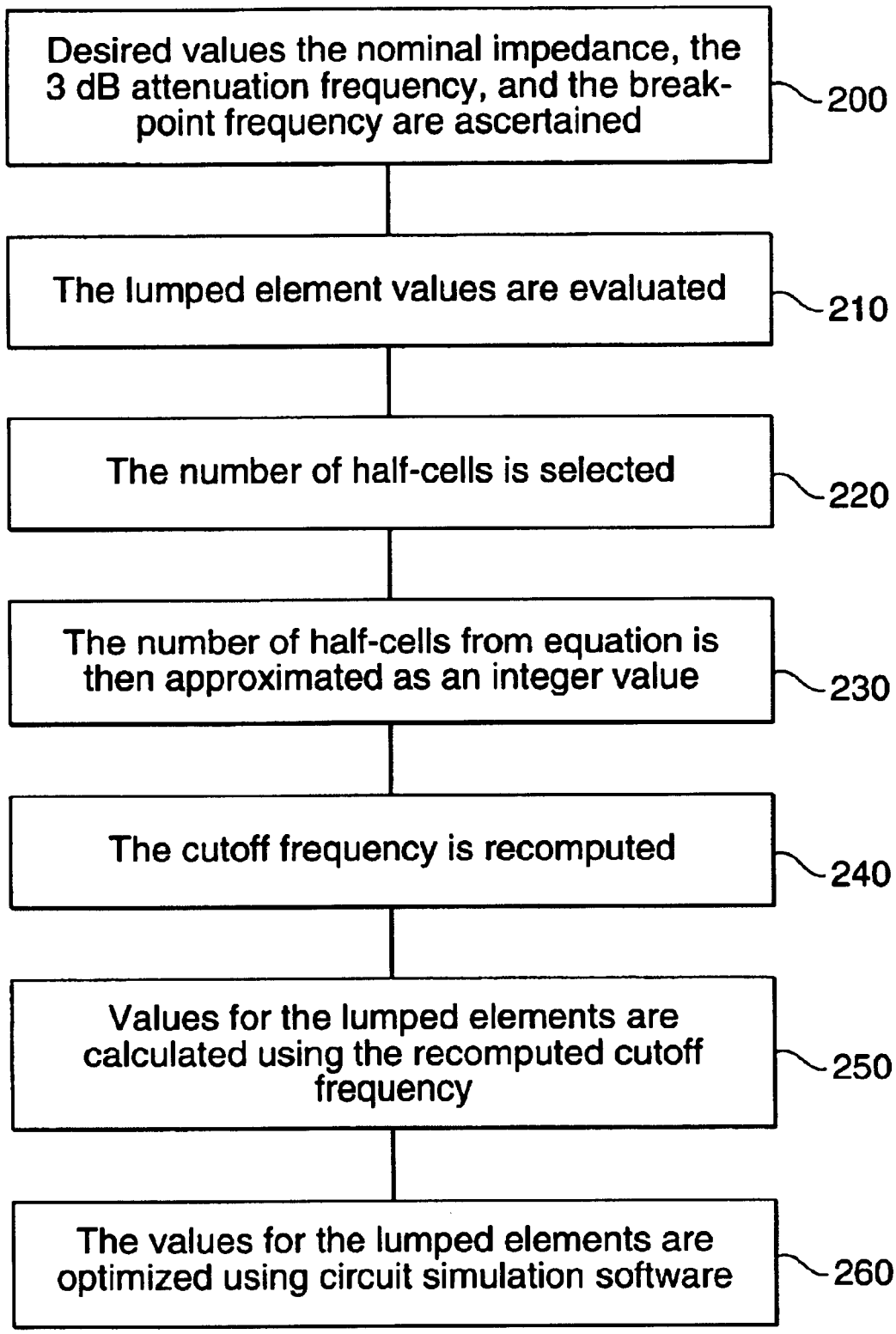
FIG. 6 shows a modified procedure for evaluating lumped element parameters of a finite lumped-element implementation of a Gaussian transmission line filter according to an embodiment of the present invention tailored for a filter design having highly linear phase characteristics.

By optimizing filters of orders 2–40 (i.e., N=1 , . . . , 20), it is found that selecting the resistance to be 15 Ω in intermediate shunt branches (excluding the first and last branches 62, 66) is optimal for this implementation. It is once again noted in this connection, that because the resistances in the shunt branch are modeled as conductances which are the inverse of resistances, the actual resistance values of the intermediary shunt branches would be expected to be on the order of half the value of the resistances for the G/2 conductances (i.e., doubling the conductance being equivalent to halving the resistance). However, in the process of optimization, it is found that the conductance of the intermediate resistances should be selected to be even higher with respect to the first and last shunt branches. This selection flattens out the phase characteristic to obtain a high degree of linearity. To obtain a phase response to within a few degrees from a linear one, this resistance should be adjusted to within tolerances on the order of 1 Ω. The flattening comes from the influence of the LC network and it is derived from the transmission-line model. This fact leads to a modified design procedure for the lumped-element prototype if the linear phase is the primary objective of the design, as follows with reference to FIG. 6.

Starting from ascertained values for $Z_c$, $f_{3dB}$, and $f_b$ (200), and following the same procedure as described for the lumped-element approximation to the complete Gaussian line to find $L_t$, $C_t$, and $G_t$, i.e., the elemental values are evaluated (210) as:

$$L_t \approx \frac{0.69 Z_c}{\omega_b} \left(\frac{\omega_b}{\omega_{3dB}}\right)^2 \quad (26)$$

$$C_t = \frac{L_t}{Z_c^2}, \text{ and,} \quad (27)$$

$$G_t = \omega_b C_t \quad (28).$$

The number of half-cells is selected (220) so to have 15 Ω ($0.3 Z_c$) resistances in intermediate shunt branches, i.e., $$N = 0.3 G_t Z_c \quad (29).$$

Combination of (26) to (29) yields the result:

$$N = 0.207 \left(\frac{\omega_b}{\omega_{3dB}}\right)^2. \quad (30)$$

In this case, the high degree of phase linearity is maintained approximately up to the cutoff frequency of the LC network, i.e., up to $$\omega_c = \frac{2}{\sqrt{LC}} = 0.6 \omega_b. \quad (31)$$

Substituting $\omega_c$ for $\omega_b$ into (30) and (31) yields the following formula for the number of half-cells in terms of the cutoff frequency and the 3 dB frequency:

$$N = 0.575 \left(\frac{\omega_c}{\omega_{3dB}}\right)^2. \quad (32)$$

The number of half-cells from equation (32) is then approximated (230) as an integer value and then the cutoff frequency is recomputed (240) to account for the lumping, or discretization, of the distributed parameters as:

$$\omega_{cN} = 1.32 \omega_{3dB} \sqrt{N} \quad (33).$$

Then, from equations (26) to (29), we obtain the remaining equations needed to evaluate the lumped elements for design of the filter:

$$L = \frac{Z_c}{\pi f_{cN}}, \quad (34)$$

$$C = \frac{L}{Z_c^2}, \text{ and} \quad (35)$$

$$R = 0.3 Z_c. \quad (36)$$

Figure 7:
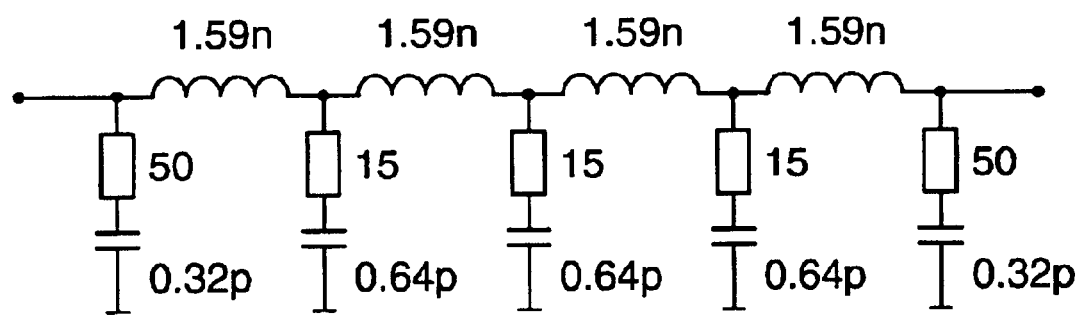
FIG. 7 illustrates an incomplete Gaussian transmission line filter in which initially calculated values for the lumped elements calculated in accordance with the procedure of FIG. 6 are depicted.

The following example presents starting values estimated for a lumped element incomplete Gaussian line filter having desired filter criterion of $Z_c$=50 Ω, $f_{3dB}$=3.787 GHz, and $f_c$=10 GHz. From equations (32) to (36), the following values for the lumped elements are calculated (250): N=4, L=1.59 nH, C=0.64 pF, and R=15 Ω. FIG. 7 shows an incomplete Gaussian transmission line in which the initially calculated values for the lumped elements are implemented.

Figure 8:
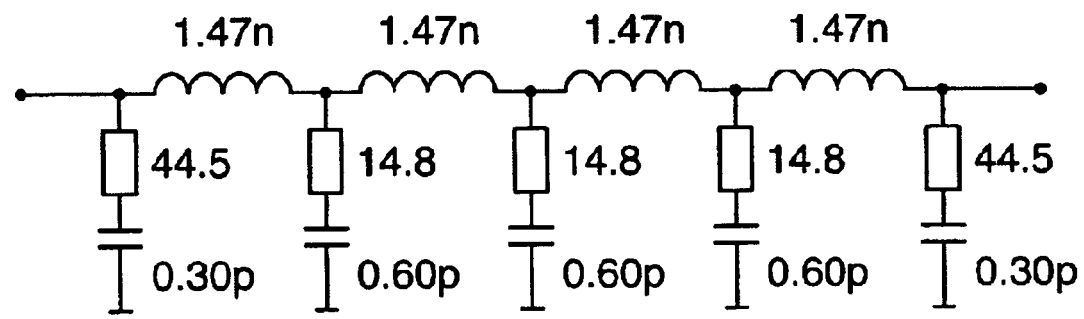
FIG. 8 illustrates the incomplete Gaussian transmission filter of FIG. 7 after optimization of the lumped element values in accordance with an embodiment of the present invention.
Figure 9:
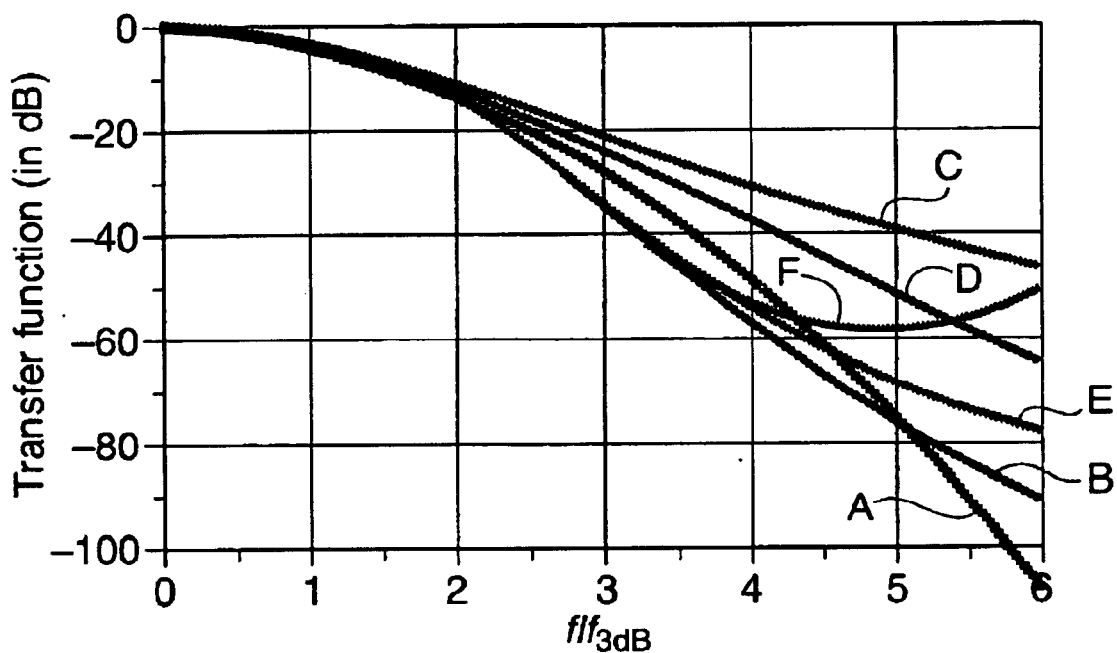
FIG. 9 is a graph of the transmission transfer functions in decibels versus normalized frequency for an ideal Gaussian filter (A), a Bessel-Thomson filter of the 10th order (B), a complete distributed Gaussian transmission line filter (C), an incomplete distributed Gaussian transmission line (D), an optimized lumped-element implementation of the incomplete Gaussian transmission line (E), and a microstrip implementation (F).
Figure 10:
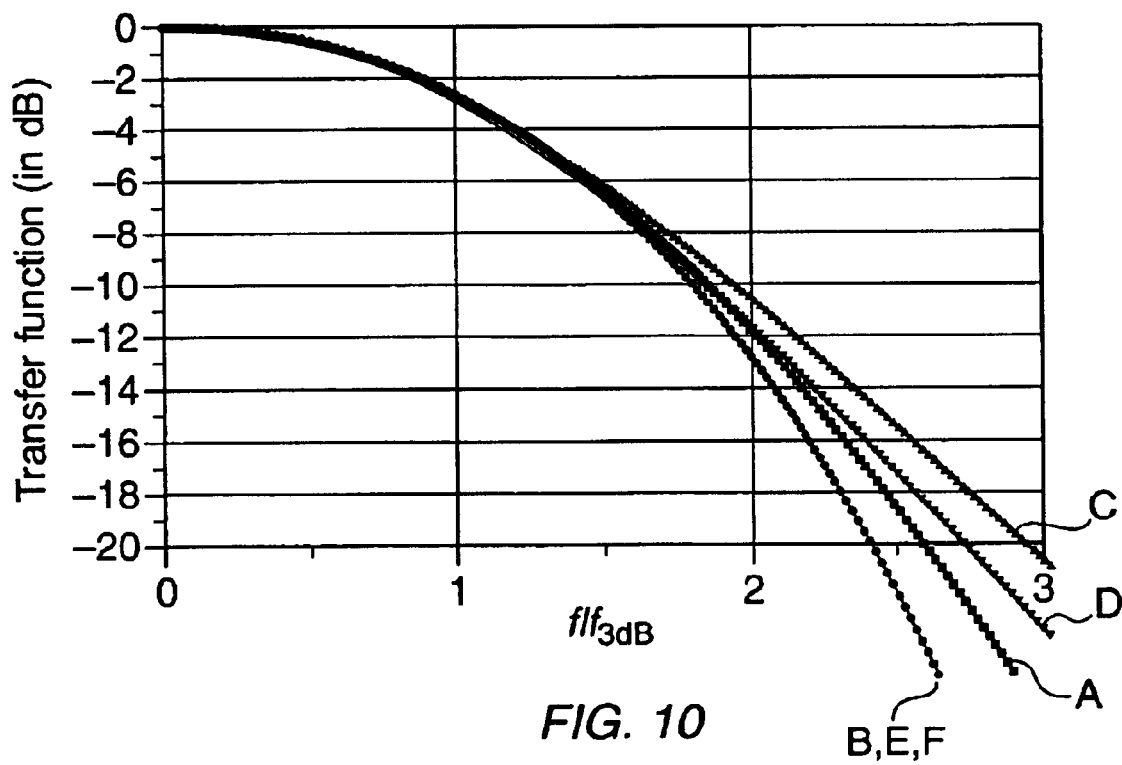
FIG. 10 shows an enlarged view of the upper left portion of the graph of FIG. 9.
Figure 11:
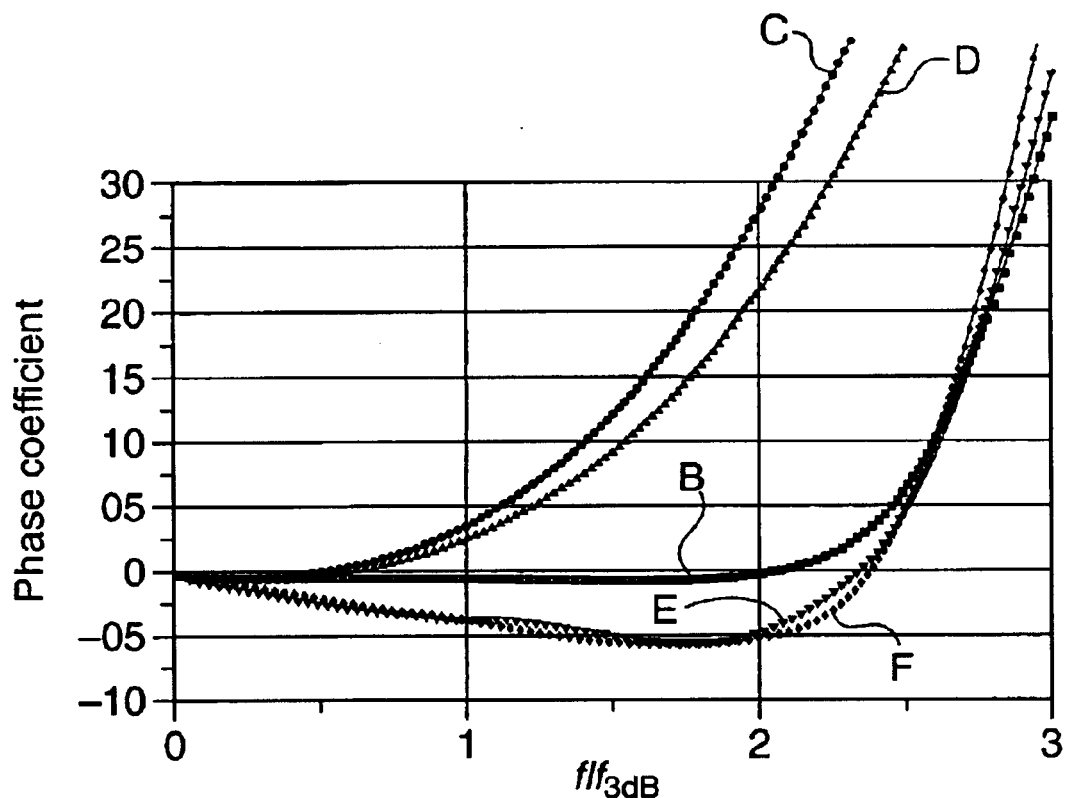
FIG. 11 is a graph of the phase coefficient versus normalized frequency for a Bessel-Thomson filter of the 10th order (B), a complete distributed Gaussian transmission line filter (C), an incomplete distributed Gaussian transmission line (D), an optimized lumped-element implementation of the incomplete Gaussian transmission line (E), and a microstrip implementation (F).
Figure 12:
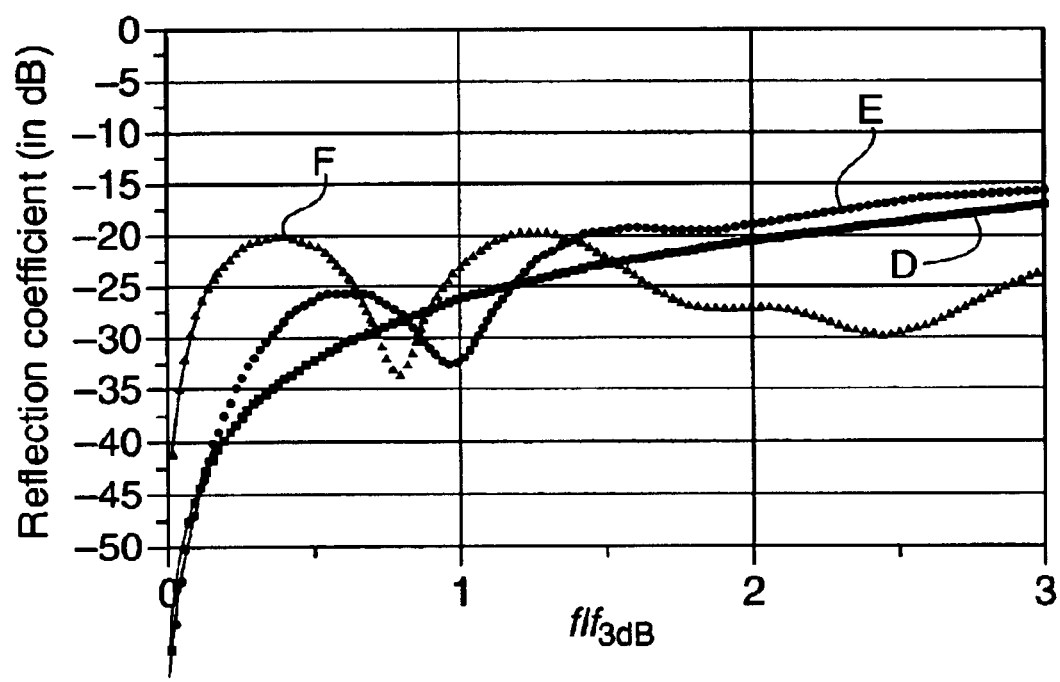
FIG. 12 is a graph of the reflection coefficient in decibels versus normalized frequency for an incomplete Gaussian transmission line filter (D), the lumped element incomplete Gaussian filter (E) and measured data for the microstrip filter (F).

After optimization (260), the lumped element values alter slightly, as shown in FIG. 8. FIGS. 9–12 compare computed characteristics of several filter designs. In particular, FIG. 9 and FIG. 10 show graphs of the magnitude of the filter transfer function in dB versus normalized frequency, with FIG. 10 showing an enlargement of the upper left section of FIG. 9. The first filter (A) is an ideal Gaussian filter. The second filter (B) is a Bessel-Thomson filter of the 10th order. The reflection coefficient of this filter is not considered, as it is high in the stopband. The third filter is a complete distributed Gaussian transmission line (C), implemented as described above with respect to equations (21) to (25). The fourth filter (D) is an incomplete Gaussian transmission line implemented as described above with respect to equations (32) to (36). The fifth filter (E) is an optimized lumped-element implementation of the incomplete Gaussian transmission line corresponding to the exemplary embodiment shown in FIG. 8. The sixth filter (F) is a microstrip implementation of the incomplete Gaussian transmission line, also designed by optimization, in which the lumped elements are inversely approximated using distributed resistance, inductance, and capacitance parameters. FIG. 11 is a graph of the complex phase portion of the transmission function versus normalized frequency of filters (B) to (F), while FIG. 12 is a graph of the reflection coefficient in dB versus normalized frequency of the incomplete Gaussian transmission line (D), the lumped element incomplete Gaussian filter (E) and measured data for the microstrip filter (F). The phase characteristics are shown after extracting linear terms. As shown, the optimized filters have a steeper amplitude characteristic than the ideal Gaussian filters (approaching the Bessel characteristic of the 10th order), a phase characteristic that is linear up to 10 GHz, and a minute reflection coefficient. FIG. 12 compares computed and measured data for the microstrip implementation.

One of the advantages of the transmission line filters described above includes the maximally flat phase characteristic achievable using the lumped element incomplete Gaussian filter and microstrip implementations according to the present invention as indicated in curves (E) and (F) of FIG. 11. Another advantage is the extremely low reflection coefficient at the ports of these filters (−15 dB) at frequencies up to three time the filter 3 dB frequency, as shown in FIG. 12. Additionally, because the topology of the lumped element design is adjustable during implementation, the amplitude and phase characteristics of these filters can be conveniently modified to fit particular needs.

In the foregoing description, the invention has been described with reference to a number of examples that are not to be considered limiting. Rather, it is to be understood and expected that variations in the various filter criteria and optimized parameters used in the complete and incomplete transmission line filters and in the respective lumped element approximations and corresponding physical implementations disclosed herein may be made by one skilled in the art and it is intended that such modifications, changes, and/or substitutions are to be included within the scope of the present invention as set forth in the appended claims.

What is claimed is:

1. A transmission line filter having low reflectivity and Gaussian characteristics comprising:
   at least one inductive element aligned along the transmission line; and
   at least one shunt configuration branching off the transmission line including a capacitive element and a resistive element;
   wherein values of the at least one inductive element, the capacitive element and the resistive element are selected such that the transmission line filter has an approximately Gaussian amplitude characteristic up to a breakdown frequency, an approximately constant, matched impedance beyond the breakdown frequency, an approximately flat group delay up to 10 GHz and a minute reflection coefficient.

2. The transmission line filter of claim 1, wherein the capacitive element and the resistive element are in series in the at least one shunt configuration.

3. The transmission line filter of claim 2, wherein at least one of the at least one inductive element, the capacitive element, and the resistive element are distributed evenly over the transmission line.

4. The transmission line filter of claim 2, further comprising:
   at least one resistive element aligned in the direction of transmission parallel to the at least one inductive element.

5. The transmission line filter of claim 2, further comprising:
   a discrete number (N) of half-cell sections distributed in series along the transmission line, each half-cell section including:
   a) an inductive element (l) and a resistive element (r) in parallel and aligned in a direction of transmission; and
   b) a resistive element (g) and a capacitive element (c) in series and aligned in a shunt configuration branching from the transmission line.

6. The transmission line filter of claim 2, further comprising:
   a number (N) of half-cell sections distributed in series along the transmission line, each half-cell section including:
   a) an inductive element (l) aligned in the direction of transmission; and
   b) a resistive element (g) and a capacitive element (c) in series and aligned in a shunt configuration branching from the transmission line.

7. The transmission line filter of claim 5, wherein an attenuation coefficient for the transmission line can be approximated by:

$$\alpha = \frac{\left(\frac{\omega}{\omega_b}\right)^2 \sqrt{rg}}{1+\left(\frac{\omega}{\omega_b}\right)^2}$$

and wherein a phase coefficient for the transmission line can approximated by:

$$\beta = \frac{\frac{\omega}{\omega_b}\sqrt{rg}}{1+\left(\frac{\omega}{\omega_b}\right)^2} + \frac{\omega\sqrt{lc}}{1+\left(\frac{\omega}{\omega_b}\right)^2},$$

where $\omega_b$ is equal to r/l.

8. The transmission line filter of claim 6, wherein a propagation coefficient for the transmission line can be approximated by:

$$\gamma = j\omega\sqrt{lc}\sqrt{\frac{1}{1+j\frac{\omega}{\omega_b}}} \approx$$

$$\omega_b\sqrt{lc}\left(\frac{1}{2}\left(\frac{\omega}{\omega_b}\right)^2 - \frac{5}{16}\left(\frac{\omega}{\omega_b}\right)^4\right) + j\omega_b\sqrt{lc}\left(\frac{\omega}{\omega_b} - \frac{3}{8}\left(\frac{\omega}{\omega_b}\right)^3\right).$$

9. A topology for modeling a transmission line filter having low reflectivity and Gaussian characteristics comprising:
   a ladder network including:
      a plurality of inductive elements aligned in series along a direction of transmission; and
      a plurality of shunt branches coupled to the inductive elements and aligned away from the direction of transmission, each shunt branch having a capacitive element and a resistive element coupled in series;
   wherein the topology is used to generate parameter values for the inductive, and capacitive and resistive elements for achieving specified filter characteristics including an approximately Gaussian amplitude characteristic up to a breakdown frequency, an approximately constant impedance beyond the breakdown frequency, an approximately flat group delay up to 10 GHz and a minute reflection coefficient.

10. The topology of claim 9, wherein the ladder network includes a plurality of resistive elements aligned in series along the direction of transmission, parallel to the plurality of inductive elements.

11. The topology of claim 9, wherein the plurality of inductive elements, the plurality of capacitive elements, and the plurality of resistive elements are modeled as being distributed per unit length over the transmission line.

12. The topology of claim 9, wherein the ladder network includes a number of (N) half-cell sections, each half-cell section having one inductive element and one shunt branch, values for the inductive, capacitive and resistive elements within all intermediate half-cells being identical.

13. The topology of claim 12, wherein the values of the inductive, capacitive and resistive elements in the intermediate half-cells, and the value of the number of half-cells are estimated in terms of a predefined port impedance ($Z_c$) and filter cutoff frequency ($f_c$) as follows:

$$N * R_{element} = R_t = 0.345 Z_c \frac{1+\left(\frac{\omega_{3dB}}{\omega_b}\right)^2}{\left(\frac{\omega_{3dB}}{\omega_b}\right)^2} \approx 0.345 Z_c \left(\frac{\omega_{3dB}}{\omega_b}\right)^2,$$

$$N * L_{element} L_t = \frac{R_t}{\omega_b}, \quad N * C_{element} = C_t = \frac{G_t}{\omega_b}\left(G_t = \frac{R_t}{Z_c^2}\right),$$

$$\text{and } N = \pi f_c \sqrt{L_t C_t}.$$

14. A method of designing a transmission line filter having low reflectivity and Gaussian characteristics, the transmission line filter having a number of half cells, each half cell including an inductive element aligned along the transmission line, and a shunt branch off of the transmission line, the shunt branch having a capacitive and a resistive element in series, the method comprising:

ascertaining values for desired filter parameters;

deriving formulas for the values of the inductive, capacitive and resistive elements in terms of the desired filter parameters and the number of half-cells;

selecting a number of half-cells for the filter required to achieve the desired filter parameters; and estimating lumped element values for the inductive, capacitive, and resistive elements using the selected number of half-cells;

wherein the lumped element values for the inductive, capacitive, and resistive elements are optimized such that the transmission line filter has an approximately Gaussian amplitude characteristic up to a breakdown frequency, an approximately constant impedance beyond the breakdown frequency, an approximately flat group delay up to 10 GHz and a minute reflection coefficient.

15. The method of claim 14, further comprising:

before deriving formulas, modeling the inductive, capacitive, and resistive elements of the transmission line as distributed line parameters.

16. A method of designing a transmission line filter having low reflectivity and Gaussian characteristics, the transmission line filter having a number of half cells, each half cell including an inductive element aligned along the transmission line, and a shunt branch off of the transmission line, the shunt branch having a capacitive and a resistive element in series, the method comprising:

ascertaining values for desired filter parameters;

deriving formulas for the values of the inductive, capacitive and resistive elements in terms of the desired filter parameters and the number of half-cells;

selecting a number of half-cells for the filter required to achieve the desired filter parameters;

estimating lumped element values for the inductive, capacitive, and resistive elements using the selected number of half-cells; and optimizing the estimated values for the lumped element values using a circuit simulator.

17. The method of claim 14, wherein the number of half-cells is selected to provide a cutoff frequency for the filter above a threshold level.

18. The method of claim 16, further comprising:

selecting the number of half-cells to obtain the optimized lumped element values; and approximating the number of half-cells selected as an integer value.

19. The method of claim 18, further comprising:

recomputing a cutoff frequency for the filter;

re-estimating lumped element values using the recomputed cutoff frequency; and re-optimizing the lumped element values using the circuit simulator.

20. The method of claim 16, further comprising:

implementing estimated lumped element values of the inductive, capacitive, and resistive elements as distributed line inductance, capacitance, and resistance respectively.

21. The method of claim 20, wherein the distributed line inductance, capacitance, and resistance is implemented using one of printed-circuit coils, transmission-line sections, and microstrip sections.

22. A method of designing a transmission filter having low reflectivity and Gaussian characteristics, the transmission line filter having a number of half cells, each half cell including an inductive element aligned along the transmission line, and a shunt branch off of the transmission line, the shunt branch having a capacitive and a resistive element in series, the method comprising:

generating a lumped element model of the transmission line filter;

estimating lumped element values for the inductive, capacitive, and resistive elements; and approximating the lumped element values using distributed inductance, capacitance, and resistance; and implementing the distributed inductance, capacitance, and resistance using one of printed-circuit coils, transmission-line sections, and microstrip sections;

wherein the estimated lumped element values for the inductive, capacitive, and resistive elements are optimized such that the transmission line filter has an approximately Gaussian amplitude characteristic up to a breakdown frequency and has an approximately constant impedance beyond the breakdown frequency, an approximately flat group delay up to 10 GHz and a minute reflection coefficient.

23. The method of claim 22, wherein the distributed inductance, capacitance, and resistance are implemented using microstrip sections.

\* \* \* \* \*